United States Patent [19]

Numata et al.

[11] Patent Number: 4,690,999
[45] Date of Patent: Sep. 1, 1987

[54] LOW THERMAL EXPANSION RESIN MATERIAL AND COMPOSITE SHAPED ARTICLE

[75] Inventors: Shun-ichi Numata; Koji Fujisaki; Noriyuki Kinjo; Junichi Imaizumi, all of Hitachi; Yoshikatsu Mikami, Shimodate, all of Japan

[73] Assignees: Hitachi, Ltd.; Hitachi Chemical Co., Ltd., both of Tokyo, Japan

[21] Appl. No.: 636,736

[22] Filed: Aug. 1, 1984

[30] Foreign Application Priority Data

Aug. 1, 1983 [JP] Japan .............................. 58-139438
Aug. 19, 1983 [JP] Japan .............................. 58-152351

[51] Int. Cl.[4] ...................... G08G 18/06; C08G 73/10
[52] U.S. Cl. ..................................... 528/188; 528/353
[58] Field of Search ................................ 528/353, 188

[56] References Cited

U.S. PATENT DOCUMENTS

| | | | |
|---|---|---|---|
| 3,179,630 | 4/1965 | Endrey | 528/188 |
| 3,179,631 | 4/1965 | Endrey | 528/353 |
| 3,179,633 | 4/1965 | Endrey | 528/353 |
| 3,708,458 | 1/1973 | Alberino et al. | 528/353 |
| 4,405,550 | 9/1983 | Hungerford | 528/353 |

*Primary Examiner*—Allan M. Lieberman
*Attorney, Agent, or Firm*—Antonelli, Terry & Wands

[57] ABSTRACT

A resin material comprising a polyimide having as chemical structural unit at least one aromatic ring which can rotate around its molecular axis but has no flexibility at another direction, said polyimide being oriented at least at a uniaxial direction, has a low thermal expansion coefficient and can be shaped together with an inorganic material into one body to give a composite shaped article.

12 Claims, 15 Drawing Figures

BEHAVIOR OF THERMAL EXPANSION FOR NO. D1

BEHAVIOR OF THERMAL EXPANSION FOR NO. A2

BEHAVIOR OF THERMAL EXPANSION FOR NO. A3

BEHAVIOR OF THERMAL EXPANSION FOR NO. F3

FIG. 12 COEFFICIENTS OF THERMAL EXPANSION FOR POLYIMIDES

DIFFRACTOGRAMS FOR BIFIX-CURED POLYIMIDES

CONFORMATIONS OF POLYIMIDES

LOW THERMAL EXPANSION RESIN MATERIAL AND COMPOSITE SHAPED ARTICLE

BACKGROUND OF THE INVENTION

1. Field of the Invention

This invention relates to a low thermal expansion resin material comprising a polyimide having a special chemical structure and being oriented and a composite shaped article using the same.

2. Description of the Prior Art

Organic polymers have by far larger coefficients of thermal expansion (coefficient of linear expansion), for example $4\times 10^{-5} K^{-1}$ or larger in most cases, even at a temperature range below the glass transition temperature compared with metals and inorganic materials. Problems caused by such large coefficients of linear expansion of organic materials are remarkably numerous. It is not too much to say that all the reasons for not progressing as desired in applications and development of organic polymers are based on this characteristic. For example, in a flexible printed circuit (FPC) comprising a film and a conductor, there is desired a film obtained by coating or hot pressing a flexible film material on a metal foil. But since it is necessary to cure and dry at a high temperature after the coating or to hot press, there arises a problem of curling of the film material due to thermal stress caused by difference in coefficients of thermal expansion after being cooled to room temperature. Usually, in order to avoid such a problem, the film and the conductor are laminated by using an adhesive which can be cured at low temperatures. But in the case of FPC which is required to have heat resistance, since the adhesive curable at low temperatures is generally poor in heat resistance, a good heat resistance for the laminate inherently cannot be exhibited even if a heat resistant film such as a polyimide film is used as substrate. On the other hand, in the case of coating, when an organic polymer is coated on a metal plate or inorganic material having a very small coefficient of thermal expansion compared with the organic polymer, there take place deformation, cracks of the film, peeling off of the film, breaking of substrate due to thermal stress caused by differences in coefficients of thermal expansion. For example, when a coating film is formed on a silicon wafer as a protective film for LSI (large-scale integrated circuit) or IC (integrated circuit), the wafer is warped, which results in making photolithography for patterning impossible, making resolving power extremely worse, or in the case of large thermal stress, peeling a passivation film, or sometimes causing cleavage and breaking of silicon wafer per se.

As mentioned above, there are a large number of problems caused by the large coefficient of linear expansion of organic polymers and for a longtime has been a desire for organic polymers having a low thermal expansion coefficient.

Under such circumstances, the present inventors have studied in detail the relationship between chemical structure and the thermal expansion coefficient by using many heat resistant resin materials, particularly by using various polyimides. There have been provided various kinds of polyimides, but the number of practically synthesized or polyimides in use are very small. Heretofore, practically synthesized, reported or marketed polyimides are those obtained by using as raw materials an aromatic diamine such as diaminodiphenyl ether, diaminodiphenylmethane, para-phenylenediamine or diaminodiphenyl sulfide, and a tetracarboxylic dianhydride such as pyromellitic dianhydride, benzophenonetetracarboxylic dianhydride, tetracarboxydiphenyl ether dianhydride, or butanetetracarboxylic dianhydride. But these polyimides have a remarkably large coefficient of linear expansion of 4 to $6\times 10^{-5} K^{-1}$.

But the present inventors have found that polyimides having an extremely small linear expansion coefficient and remarkably excellent tensile strength compared with those mentioned above can be obtained from a special aromatic diamine and a tetracarboxylic dianhydride mentioned below. This invention is based on such a finding.

SUMMARY OF THE INVENTION

It is an object of this invention to provide a low thermal expansion resin material having an extremely small thermal expansion coefficient corresponding to that of an inorganic material such as a metal, ceramic or glassy material as well as excellent mechanical properties, and a composite shaped article using the same.

This invention provides a low thermal expansion resin material comprising a polyimide having as chemical structural unit at least one aromatic ring which can rotate around its molecular axis but has no flexibility at another direction, said polyimide being oriented at least in a uniaxial direction.

This invention also provides a composite shaped article comprising an inorganic material and a low thermal expansion resin material shaped into one body, said resin material comprising a polyimide having as chemical structual unit at least one aromatic ring which can rotate around its molecular axis but has no flexibility in another direction, said polyimide being oriented at least in a uniaxial direction.

DETAILED DESCRIPTION OF THE PREFERRED EMBODIMENTS

The chemical structure as main chain of the low thermal expansion polyimide of this invention includes, for example, as follows:

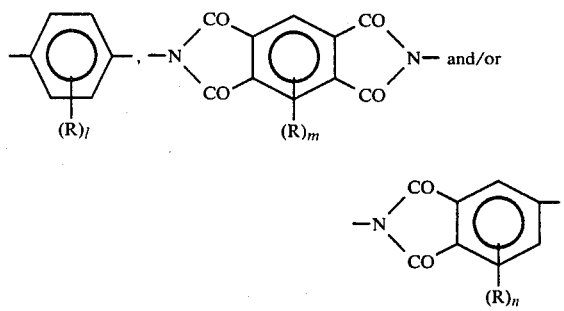 and/or

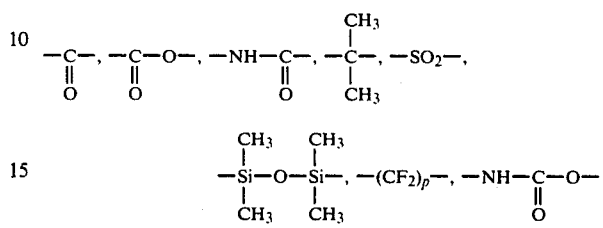

wherein R is an alkyl group, a fluorinated alkyl group, an alkoxy group, a fluorinated alkoxy group, an acyl group or a halogen; l is zero or an integer of 1 to 4; m is zero or an integer of 1 to 2; and n is zero or an integer of 1 to 3. The low thermal expansion resin material of this invention has lower thermal expansion, higher strength, higher elasticity and higher heat resistance than other polymers, even if the molecular arrangement of the resin material is random. When the resin material of this invention is subjected to a molecular orientation treatment, these properties are by far improved.

Generally speaking, aromatic polymers are rigid but disadvantageously brittle. In order to make the whole polymer flexible, there is introduced a flexible bond such as —O—, —S—, —($CH_2$)$_p$— (p is an integer of 1 or more), $$-\underset{\underset{O}{\|}}{C}-,\ -\underset{\underset{O}{\|}}{C}-O-,\ -NH-\underset{\underset{O}{\|}}{C}-,\ -\underset{\underset{CH_3}{|}}{\overset{\overset{CH_3}{|}}{C}}-,\ -SO_2-,$$

$$-\underset{\underset{CH_3}{|}}{\overset{\overset{CH_3}{|}}{Si}}-O-\underset{\underset{CH_3}{|}}{\overset{\overset{CH_3}{|}}{Si}}-,\ -(CF_2)_p-,\ -NH-\underset{\underset{O}{\|}}{C}-O-$$

or the like thereinto. Alternatively, when the bonding position of aromatic rings occurs at an O— or m—position, the whole polymer becomes flexible. The same bendings can be applied to polyimides. Polyimides now industrially produced have bondings selected from the above-mentioned ones. Therefore, polyimides having low thermal expansion as claimed in this invention have not been known.

The low thermal expansion polyimides of this invention includes the following repeating units:

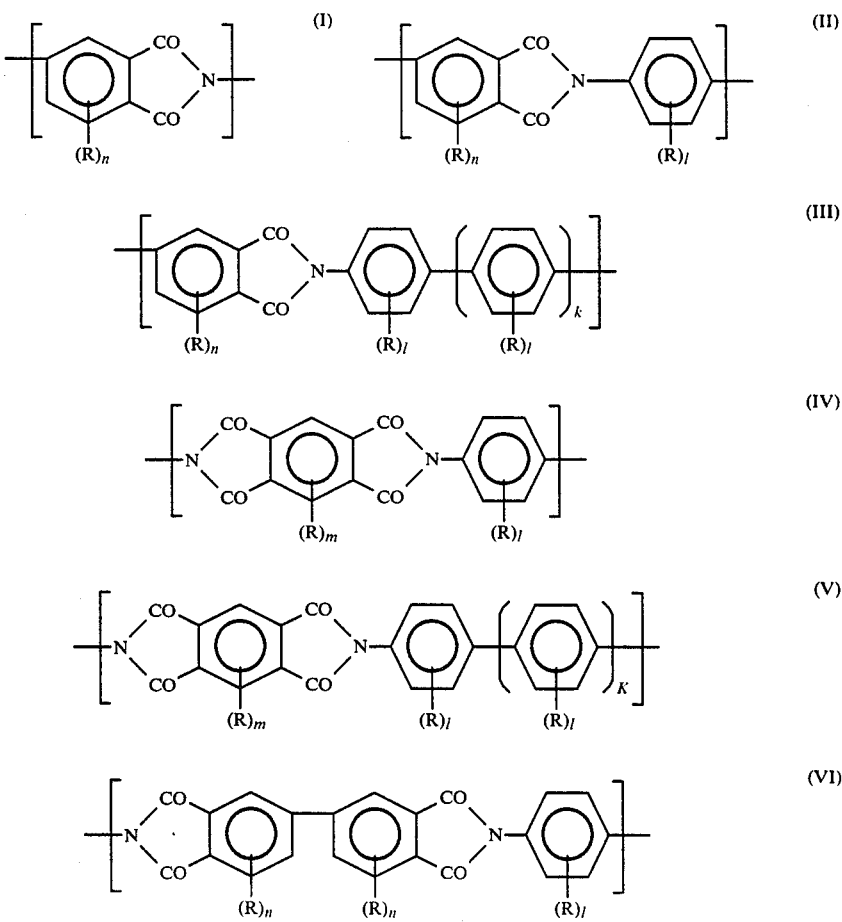

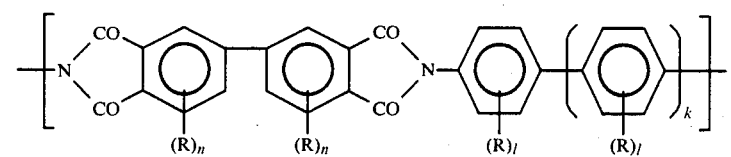

(VII)

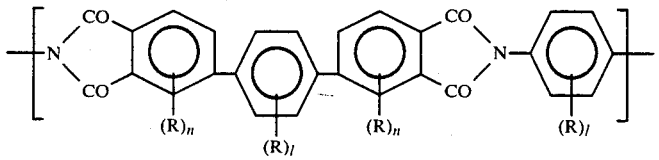

(VIII)

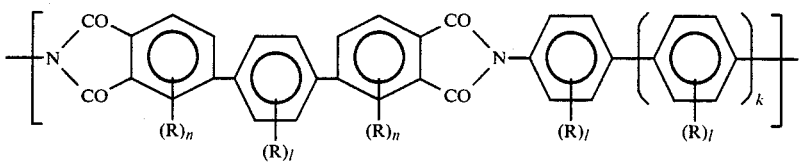

(IX)

wherein R, l, m and n are as mentioned above; and k is zero or an integer of 1 to 3.

Figure 1:
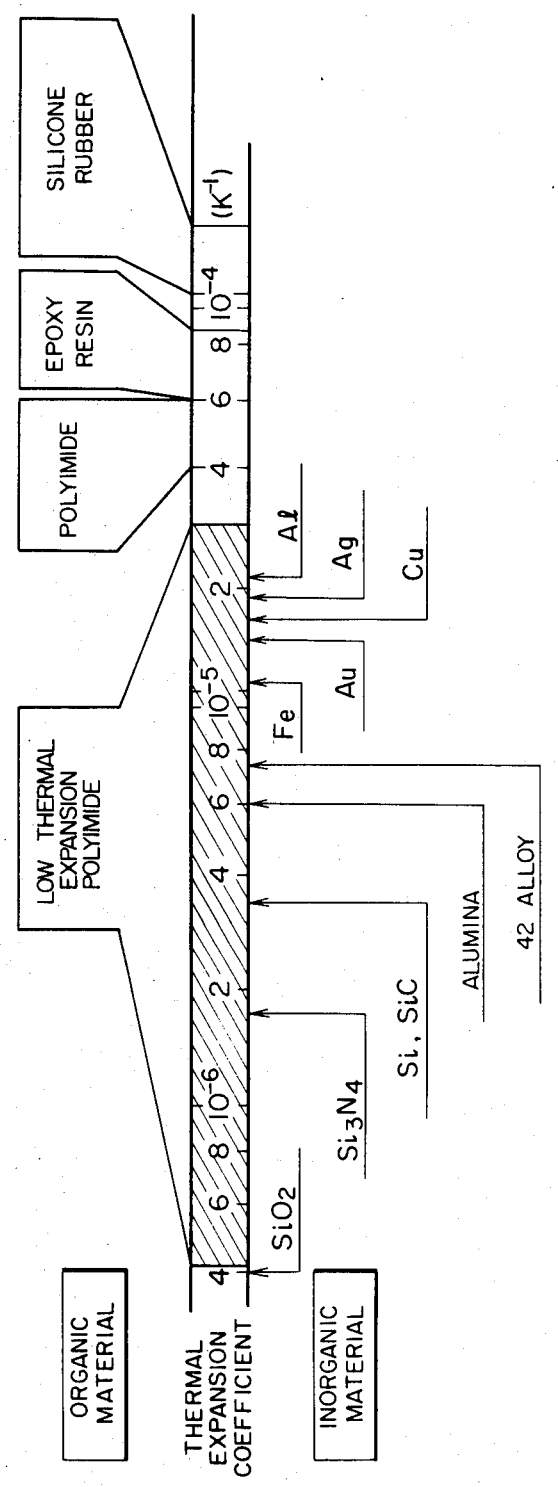
FIG. 1 is a graph showing coefficients of thermal expansion of various materials.

FIG. 1 is a graph showing thermal expansion coefficients of various materials. As shown in FIG. 1, general organic polymers have larger thermal expansion coefficients than metals and ceramics, but the oriented polyimide of this invention has a clearly smaller thermal expansion coefficient compared with the general organic polymers. Since the thermal expansion coefficient of the polyimides of this invention is as small as those of inorganic materials such as metals and ceramics it is possible when the resin material is used in combination with these inorganic materials, that no thermal stress or warpage takes places due to dimensional change upon a change in temperature: this is very important from an industrial point of view. It is not too much to say that the most important defect of conventional organic materials is that the thermal expansion coefficients of organic materials are much larger than that of inorganic materials.

The low thermal expansion polyimide of this invention can be produced by polymerization of an aromatic aminodicarboxylic acid derivative, or a reaction of an aromatic diamine or an aromatic diisocyanate with an aromatic tetracarboxylic acid derivative. The term derivative of tetracarboxylic acid refers to an ester, an acid anhydride, an acid chloride, or the like. Considering the synthesis process, the use of an acid anhydride is preferred.

The polymerization can generally be carried out at 0 to 200° C. in a solvent such as N-methylpyrrolidone (NMP), dimethyl formamide (DMF), dimethyl acetamide (DMAC), dimethyl sulfoxide (DMSO), dimethyl sulfate, sulfolane, butyrolactone, cresol, phenol, halogenated phenol, cyclohexane, dioxane, etc., alone or as a mixture thereof.

Examples of the aromatic aminodicarboxylic acid derivative are 4-aminophthalic acid, 4-amino-5-methylphthalic acid, 4-(p-anilino)-phthalic acid, 4-(3,5-dimethyl-4-anilino)-phthalic acid, esters thereof, acid anhydrides thereof, acid chlorides thereof, etc. These aminodicarboxylic acid derivatives can be used alone or as a mixture thereof.

Examples of the aromatic diamine are p-phenylenediamine, 2,5-diaminotoluene, 2,5-diaminoxylene, diaminodurene, 2,3,5,6-tetramethyl-p-phenylenediamine, 2,5-diaminobenzotrifluoride, 2,5-diaminoanisole, 2,5-diaminoacetophenone, 2,5-diaminobenzophenone, 2,5-diaminodiphenyl, 2,5-diaminofluorobenzene, benzidine, o-tolidine, m-tolidine, 3,3',5,5'-tetramethylbenzidine, 3,3'-dimethoxybenzidine, 3,3'-di(trifluoromethyl)benzidine, 3,3'-diacetylbenzidine, 3,3'-difluorobenzidine, octafluorobenzidine, 4,4''-diaminoterphenyl, 4,4'''-diaminoquataphenyl, etc. These diamines can be used alone or as a mixture thereof. It can also be possible to use diisocyanate compounds of these aromatic diamines.

Examples of the aromatic tetracarboxylic acid derivatives are pyromellitic acid, methylpyromellitic acid, dimethylpyromellitic acid, di(trifluoromethyl)pyromellitic acid, 3,3',4,4'-biphenyltetracarboxylic acid, 5,5'-dimethyl-3,3',4,4'-biphenyltetracarboxylic acid, p-(3,4-dicarboxyphenyl)benzene, esters thereof, acid anhydrides thereof, acid chlorides thereof, etc. These tetracarboxylic acid derivatives can be used alone or in a mixture thereof.

The polyimide of this invention is, even if not oriented, lower in thermal expansion, higher in strength, and higher in elasticity, than other polymers, but when the molecular chain is oriented, these properties are by far highly enhanced. For example, the molecular chain can be oriented by stretching a film-like article uniaxially or biaxially. It is known that an aromatic polyimide generally becomes lower in thermal expansion, higher in elasticity and higher in strength by an orientation treatment, but such effects are by far small compared with the effects in this invention. The orientation of polymer chain can be effected by not only stretching of a film using a stretcher but also by applying shrinkage caused by a curing reaction of polyimide or during a procedure of changing from a precursor varnish to polyimide shaped article from shrinkage caused by evaporation of the solvent. For example, by preventing the shrinkage at the time of curing of a coated varnish, the orientation of molecular chain becomes possible. The stretching amount by such curing and shrinkage is very small compared with a conventional stretching method, but even such an orientation treatment is sufficiently effective in the polyimide of this invention. In the case of stretching a film-like shaped article, when a completely cured material is to be stretched, the stretching should be conducted at a very high temperature because of extremely high glass transition temperature of polyimide, and even if stretched at such a high temperature, the orientation is very difficult due to very strong intermolecular cohesive force. In order to orient easily, it is preferable to stretch a polyimide containing a solvent to some extent or a polyamide-acid having a low glass transition temperature to orient the molecule, followed by complete curing.

Figure 15:
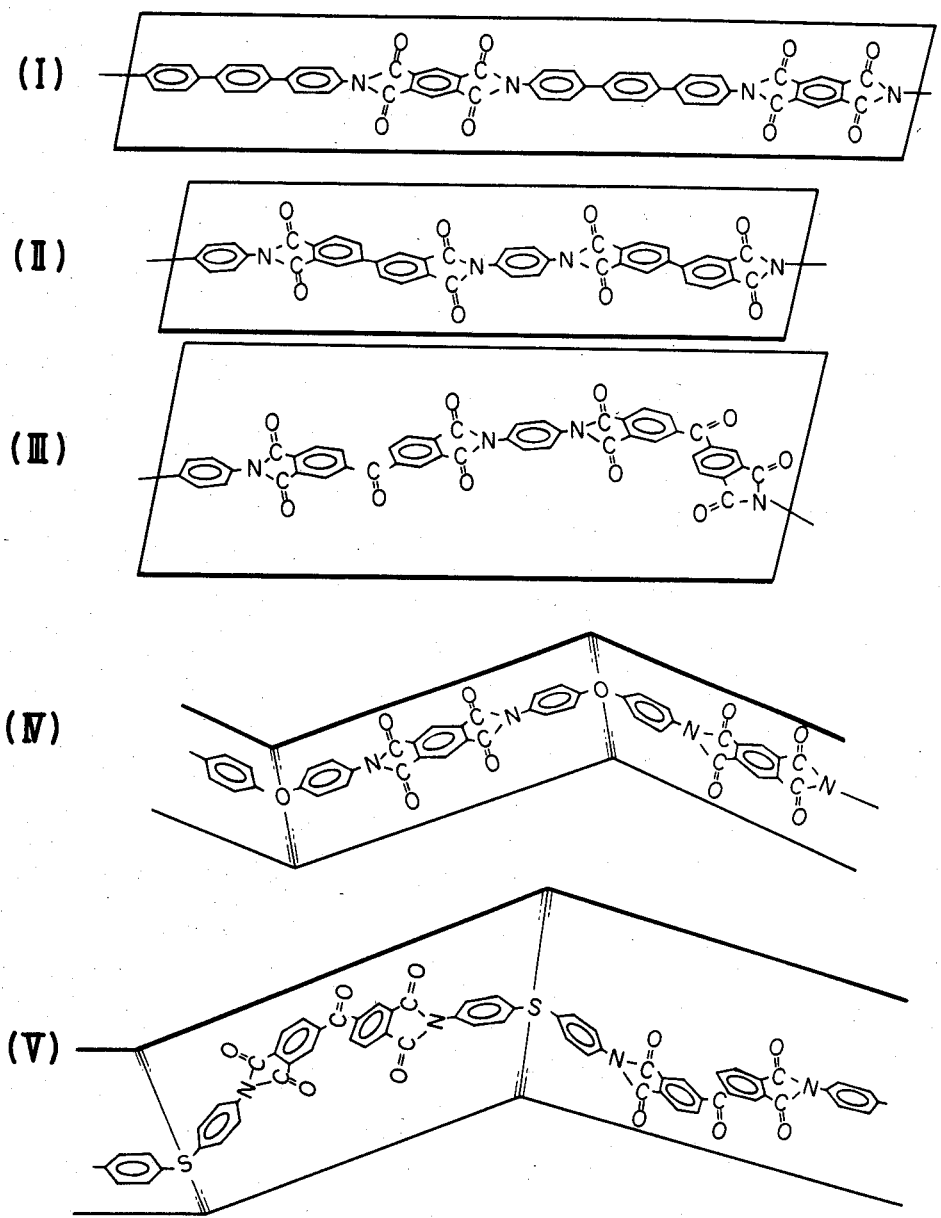
FIG. 15 is a series of illustrations showing conformations of polyimides.

That the polyimide of this invention is very low in thermal expansion is quite different from the common knowledge of conventional polymers and thus cannot be expected from prior art. Reasons for this seem to be that the polyimide of this invention has an almost linear structure as shown in FIG. 15 (I) and (II).

The polyimide of this invention is very low in thermal expansion but in some cases slightly brittle. In such a case, the brittleness of the polyimide of this invention can be improved by blending or copolymerization with one or more other polymers without significantly increasing the thermal expansion coefficient. It is also possible to adjust the thermal expansion coefficient of the polyimide of this invention by blending or copolymerization with one or more other polymers considering the thermal expansion coefficient of inorganic material in the case of forming a composite shaped article. From the viewpoint of heat resistance, the use of polyimide as other polymers is preferred. Such a polyimide can be obtained from a diamine and a tetracarboxylic acid or a derivative thereof mentioned below.

Examples of such a diamine are m-phenylenediamine, 4,4'-diaminodiphenyl methane, 1,2-bis(anilino)ethane, 4,4'-diaminodiphenyl ether, diaminodiphenyl sulfone, 2,2-bis(p-aminophenyl)propane, 2,2-bis(p-aminophenyl)hexafluoropropane, 3,3'-dimethyl-4,4'-diaminodiphenyl ether, 3,3'-dimethyl-4,4'-diaminodiphenylmethane, diaminotoluene, diaminobenzotrifluoride, 1,4-bis(p-aminophenoxy)benzene, 4,4'-bis(p-aminophenoxy)biphenyl, 2,2-bis{4-(p-aminophenoxy)phenyl}propane, diaminoanthraquinone, 4,4'-bis(3-aminophenoxyphenyl)diphenyl sulfone, 1,3-bis(anilino)hexafluoropropane, 1,4-bis(anilino)octafluorobutane, 1,5-bis(anilino)decafluoropentane, 1,7-bis(anilino)tetradecafluoroheptane, diaminosiloxanes represented by the formula:

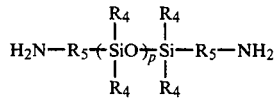

or by the formula:

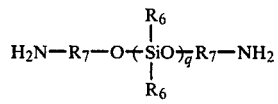

wherein $R_5$ and $R_7$ are independently a divalent organic group such as alkylene, phenylene, substituted phenylene, etc.; $R_4$ and $R_6$ are independently a monovalent organic group such as alkyl, phenyl, substituted phenyl, etc.; and p and q are independently integers of 1 or more, 2,2-bis{4-(p-aminophenoxy)phenyl}hexafluoropropane, 2,2-bis{4-(3-aminophenoxy)phenyl}hexafluoropropane, 2,2-bis{4-(2-aminophenoxy)phenyl}hexafluoropropane, 2,2-bis{4-(4-aminophenoxy)-3,5-dimethylphenyl}hexafluoropropane, 2,2-bis{4-(4-aminophenoxy)-3,5-bis(trifluoromethyl)phenyl}hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-5-trifluoromethylphenoxy)diphenyl sulfone, 2,2-bis{4-(4-amino-3-trifluoromethylphenoxy)phenyl}hexafluoropropane and the like. It is also possible to use aromatic diisocyanates obtained by reacting these diamines with phosgene such as tolylene diisocyanate, diphenylmethane diisocyanate, naphthalene diisocyanate, diphenyl ether diisocyanate, phenylene-1,3-diisocyanate, etc. These diamines and diisocyanates can be used alone or as a mixture thereof.

Examples of such a tetracarboxylic acid or a derivative thereof are 2,3,3',4'-tetracarboxydiphenyl, 3,3',4,4'-tetracarboxydiphenyl ether, 2,3,3',4'-tetracarboxydiphenyl ether, 3,3',4,4'-tetracarboxybenzophenone, 2,3,3',4'-tetracarboxybenzophenone, 2,3,6,7-tetracarboxynaphthalene, 1,4,5,7-tetracarboxynaphthalene, 1,2,5,6-tetracarboxynaphthalene, 3,3',4,4'-tetracarboxydiphenylmethane, 2,2-bis(3,4-dicarboxyphenyl)propane, 2,2-bis(3,4-dicarboxyphenyl)hexafluoropropane, 3,3',4,4'-tetracarboxydiphenyl sulfone, 3,4,9,10-tetracarboxyphenylene, 2,2-bis{4-(3,4-dicarboxyphenoxy)phenyl}propane, 2,2-bis{4-(3,4-dicarboxyphenoxy)phenyl}hexafluoropropane, butanetetracarboxylic acid, cyclopentanetetracarboxylic acid, esters thereof, acid anhydrides thereof, acid chlorides thereof, etc. These tetracarboxylic acids or derivatives thereof can be used alone or as a mixture thereof.

The polyimide of this invention can be modified with a compound having one or more reactive functional groups or by introducing a crosslinked structure or ladder structure therein, as mentioned below. (i) Modification with a compound of the formula (X) to introduce one or more pyrrolone rings or isoindoloquinazolinedione rings.

wherein $R^1$ is an aromatic organic group having a valance of $2+x$; Z is a $NH_2$ group, $CONH_2$ group or $SO_2NH_2$ group and is positioned at an ortho position to the amino groups; and x is 1 or 2.

(ii) Modification with an amine, diamine, dicarboxylic acid, tricarboxylic acid, tetracarboxylic acid, or a derivative of these compounds, these compounds having at least one polymerizable unsaturated bond, to form a crosslinked structure at the time of curing. Examples of these unsaturated compounds are maleic acid, nadic acid, tetrahydrophthalic acid, ethynylaniline, and derivatives thereof.

(iii) Modification with an aromatic amine having a phenolic hydroxyl group or a carboxyl group to form a cross-linked structure by using a crosslinking agent reactive with the phenolic hydroxyl group or carboxyl group.

In order to shape the low thermal expansion polyimide and an inorganic material into one body to form a composite shaped article, adhesiveness is important in this invention. As the inorganic material, there can be used metals such as Cu, Cr, Au, Ag, Ni, Al, Fe, Co, Zn, Pb, Sn, Ti, Mo, Pd, etc., alloys thereof, Si, SiC, $SiO_2$, $Si_3N_4$, $Al_2O_3$, BN and the like ceramics, $Fe_2O_3$, semiconductors such as Ga·As, glass, etc. in the form of film, plate, powder, fiber, etc. In order pertain strong adhesiveness, it is preferable to roughen the surface of inorganic material, or to subject the inorganic material to a surface treatment with a silane coupling agent, a titanate coupling agent, aluminum alcholate, aluminum chelate, zirconium chelate, aluminum acetylacetone, etc. These surface treating agents can be added to the low thermal expansion polyimide. The adhesivenss of the polyimide to inorganic materials can be improved by modifying the polyimide with a siloxane containing diamine, or a tetracarboxylic acid or a derivative thereof.

The low thermal expansion resin material of this invention may include one or more inorganic powders, organic powders, metal powders, fibers, chopped strands in order to further lower the thermal expansion coefficient, to enhance elasticity or to control fluidity.

The composite shaped article obtained by shaping the low thermal expansion resin material and the inorganic material into one body can be used as follows:

(1) IC or LSI having a carrier film
(2) a flat cable
(3) a flexible printed circuit
(4) LSI having a wiring insulating film
(5) LSI having a moisture resistant protective film
(6) LSI having an α-rays shielding film
(7) a film insulating coil
(8) a semiconductor having a passivation film
(9) a metal core printed board having a polyimide insulating film The low thermal expansion resin material of this invention can be used as follows.

(10) a solar cell
(11) organic fibers
(12) FRP (fiber reinforced plastic) reinforced with low thermal expansion polyimide fibers
(13) an organic fiber The composite shaped articles of this invention obtained by shaping the low thermal expansion resin material and the inorganic material into one body will be explained referring to the drawings.

Figure 2:
FIG. 2 is a cross-sectional view of a flexible printed circuit obtained by direct coating.

FIG. 2 is a cross-sectional view of a flexible printed circuit obtained by coating a varnish of precursor of the low thermal expansion polyimide 2 directly on a copper foil 1, curing the resin while preventing shrinkage by curing, followed by patterning of the copper foil. Since the polyimide has low thermal expansion, curling does not take place due to differences in thermal expansion coefficients even when the polyimide is cooled to room temperature after being cured. As a result, there can be obtained a flat flexible printed circuit. In the case of conventional FPC, since an adhesive is used, heat resistance is largely lowered. In contrast, in this invention, there is no lowering in heat resistance and the adhesive strength is very strong.

Figure 3:
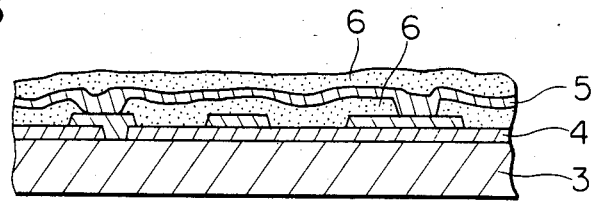
FIG. 3 is a cross-sectional view of LSI having a multi-layer wiring structure.

FIG. 3 is a cross-sectional view of LSI having a multi-layer wiring structure. Numeral 3 denotes a silicon wafer, 4 a $SiO_2$ film, 5 Al (aluminum) wiring, and 6 an insulating thin film of the low thermal expansion polyimide. When the insulating thin film is formed by a spin coating method, level differences of aluminum wiring can remarkably be lessened to give a flat and highly reliable wiring structure. Further since the thermal expansion is very low, stress to the element is very small. When the thermal stress is large, there arise cracks in the element. Further, the low thermal expansion resin material of this invention can easily be processed. The etching speed is about 2 times as fast as that of a conventional polyimide. In FIG. 3, when the surface layer 6 is made of an inorganic film such as $SiO_2$ film produced by a chemical vapor deposition (CVD) method, moisture resistance can be improved. In such a case, when the underlying insulating film is made from a conventional polyimide, cracks form on the surface inorganic film. Therefore, the underlying insulating film should be made from the polyimide of this invention.

Figure 4:
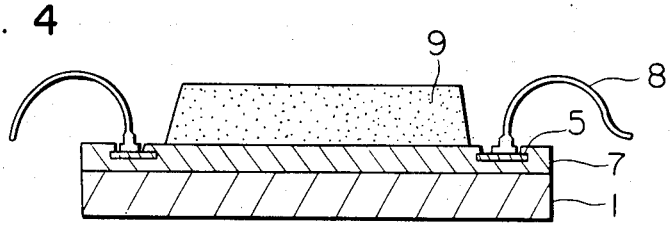
FIG. 4 is a cross-sectional view of a memory element having an α-rays shielding layer.

FIG. 4 is a cross-sectional view of a memory element having an α-rays shielding layer. Numeral 7 denotes a wiring layer and 8 a lead wire. When the low thermal expansion polyimide 9 is used as α-rays shielding layer, since differences in thermal expansion coefficients among a silicon wafer 1 and the wiring layer 7 are very small, no cracks or peeling occur due to thermal stress as in the case of using a conventional polymer, and there arises no problem of lowering of resolving power at the time of patterning of a photoresist due to warpage of the wafer. Further, since the polyimide of this invention is remarkably excellent in heat resistance as compared with conventional polyimides, it is suitable for use in glass encapsulated semiconductior element. The pyrolysis rate of the polyimide of this invention is about 1/10 of that of conventional polyimides.

When the low thermal expansion polyimide of this invention is used as insulating film for LSI shown in FIGS. 3 and 4, the shrinkage at the time of curing is prevented to give a low thermal expansion.

Figure 5:
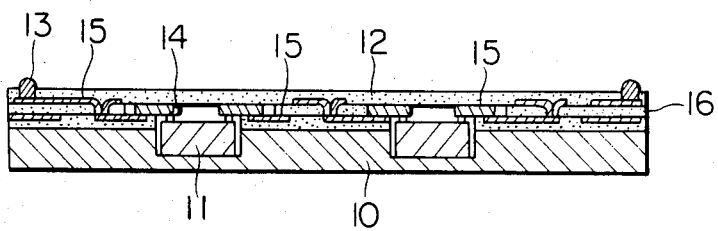
FIG. 5 is a cross-sectional view of a metal core wiring board mounting a film-carrier type LSI.

FIG. 5 shows a cross-sectional view of a metal core wiring board (a metal-plate-base printed wiring board) mounting a film-carrier type LSI. Numeral 10 denotes a metal substrate, 11 a LSI chip produced by a film-carrier method, 12 a carrier film using the low thermal expansion polyimide, and 13 a terminal. Since the carrier film 12 is made from the low thermal expansion polyimide, there can be obtained LSI 11 with high accuracy and high density. Further, since the stress applied to a solder ball 14 for bonding is reduced remarkably, breaking as a result of fatigue is also reduced. Further, by applying the low thermal expansion polyimide to an insulating film 16 at a wiring portion 15 formed on the metal substrate 10, there can be obtain a printed wiring board without bending, which results in making high accuracy high density assembly possible.

Figure 6:
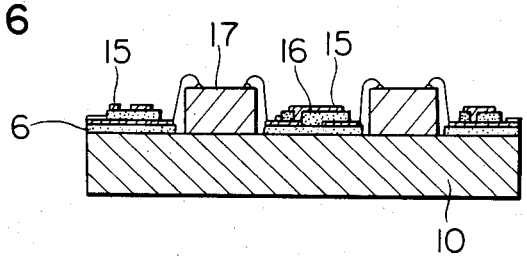
FIG. 6 is a cross-sectional view of a metal-plate-based printed circuit mounting a LSI bonded by lead wire.

FIG. 6 is a cross-sectional view of a metal-plate-based printed circuit mounting a LSI bonded by lead wire. Numeral 17 denotes a LSI chip obtained by a lead-wire bonding method. Other numerals are the same as those in FIG. 5, etc.

The low thermal expansion polyimide of this invention can effectively be used in the following application, although not particularly shown in a drawing. When a metal foil such as stainless steel foil coated with a thin film of the low thermal expansion polyimide is used as a substrate in a solar cell using amorphous silicon, the generation of cracks on the amorphous silicon thin film is reduced remarkably compared with the case of using conventional polyimides.

When the low thermal expansion polyimide is used as matrix resin for fiber reinforced laminates, not only the thermal expansion coefficient at the direction along the layers by the fiber reinforcement but also that at the flatwise direction, that is, perpendicular to the direction along the layers, can be reduced. Further, since the difference in thermal expansion coefficients between the fiber material and the polyimide is small, there arises no local thermal stress or interfacial peeling due to heat shock, and the like.

When the low thermal expansion polyimide of this invention is used as a molding material, even if an insert made of a metal or ceramic is molded together, there takes place no problem of generation of cracks, or cracks and deformation of the insert per se.

When the low thermal expansion polyimide is used in the form of fiber, for example, as reinforcing fibers for FRP, the weight-saving is more remarkable than the use of glass fiber. Further, when it is used as multi-layer wiring board for computors, the dielectric constant becomes smaller compared with the case of using glass fiber.

The composite shaped article of this invention can be shaped into one body directly or by using an adhesive or binder.

This invention is illustrated by way of the following Examples.

EXAMPLES 1 to 8, COMPARATIVE EXAMPLES 1 to 16

In a four-necked flask equipped with a thermometer, a stirring apparatus, a reflux condenser, and a nitrogen introducing tube, a diamine was placed in an amount as shown in Table 1 and dissolved with 850 g of N-methyl-2-pyrrolidone (NMP). Then, the flask was dipped in a water bath at 0° to 50° C. and a tetracarboxylic acid dianhydride as shown in Table 1 was added thereto while controlling the exothermic heat. After dissolving the tetracarboxylic dianhydride, the water bath was removed and the reaction was continued for about 5 hours at near room temperature to give a polyamide-acid varnish. When the viscosity of varnish became too high, stirring with heating (cooking) at 80° to 85° C. was continued until the viscosity became 50 poises at 25° C.

The thermal expansion coefficient of polyimide obtained by heating a polyamide-acid was measured as follows. A varnish was coated uniformly on a glass plate by using an applicator and dried at 80° to 100° C. for 30 to 60 minutes to make a film-like form. Then, the film was stripped off from the glass plate and fixed on an iron frame (bifix cure) or hung by using a spring to allow free shrinkage (free cure), and held at 200° C., 300° C. or 400° C. for 60 minutes to give a polyimide film of 20 to 200 μm thick. A film of 3 mm × 80 mm was cut off and placed between two glass plates, and heated at 400° C. again, followed by gradual cooling to remove residual strain. Then, dimensional change was measured under conditions of 5° C./min by using a thermal mechanical analyzer and the thermal expansion coefficient was obtained from the dimensional change amount below the glass transition temperature. As mentioned above, accurate thermal expansion coefficient cannot be measured, unless absorbed moisture or solvent in film or residual strain by imidization is removed sufficiently and the imidization reaction is substantially completed. If an absorbed moisture is present, the thermal expansion coefficient of the film is apparently measured with a lower value at a temperature range of room temperature to 150° C. due to removal of moisture. Further, if the residual strain is retained or the imidization reaction is is not completed, the linear expansion coefficient is sometimes apparently measured with a lower value due to the removal of residual strain near the glass transition temperature (Tg) or shrinkage by dehydration by imidization reaction. Further, when the film is fixed on the iron frame and cured and broken during the curing, the thermal expansion coefficient is measured with a rather higher value due to insufficient orientation treatment. These factors should be taken into consideration.

Figure 7:
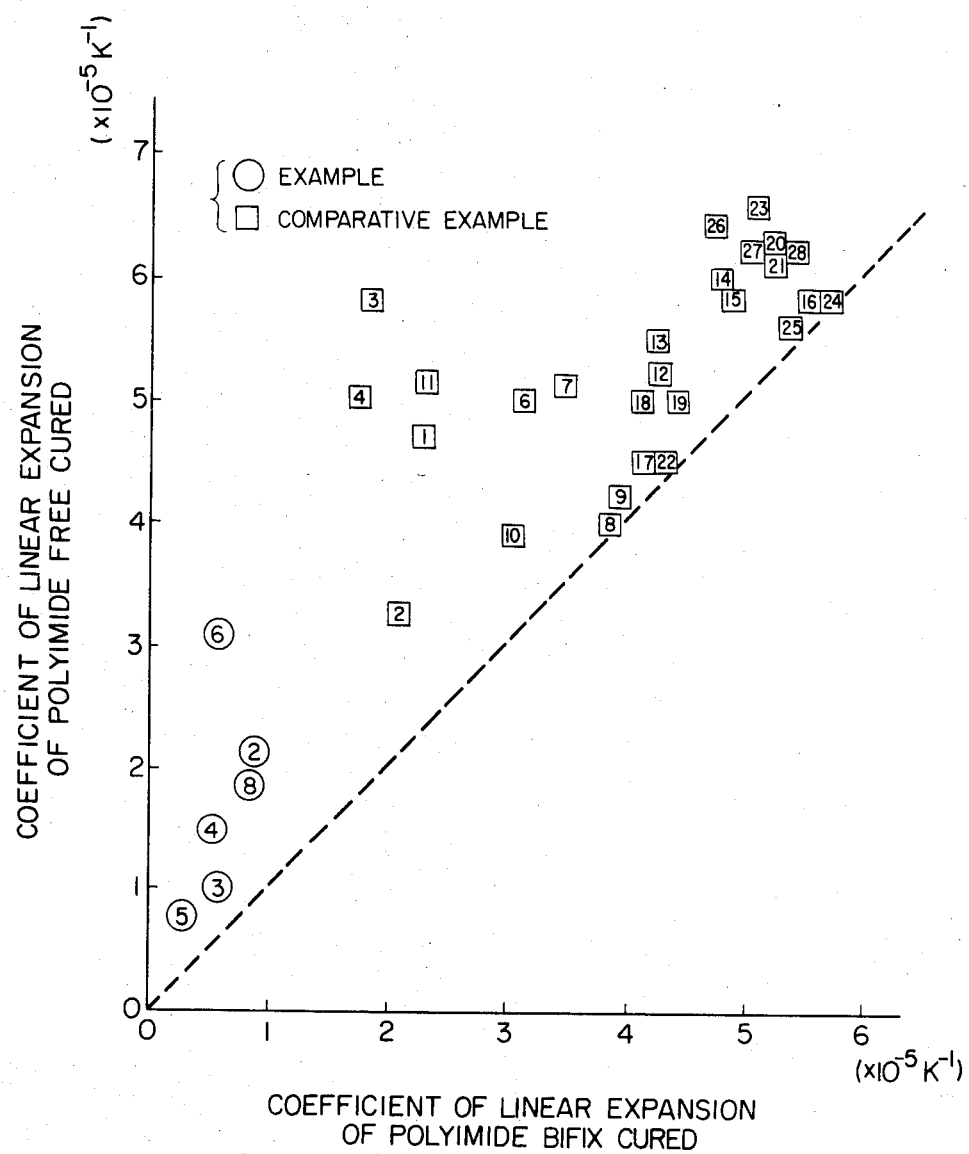
FIG. 7 is a graph showing properties of the polyimides of this invention.

Table 1 shows thermal expansion coefficients of polyimide films after bifix cured and free cured. Further, the data on Table 1 are plotted in FIG. 7 taking the linear expansion coefficients by free cure of polyimide along the abscissa axis and the linear expansion coefficients by bifix cure of polyimide along the ordinate axis. As is clear from FIG. 7, the polyimides of this invention clearly have very low thermal expansion coefficients compared with conventional polyimides.

From the viewpoint of chemical structure, the low thermal expansion can be obtained when P-PDA, DATP, o-TOLID, and p-DATOL are used as diamine, and PMDA and BPDA are used as tetracarboxylic dianhydride. In other words, the following conditions can be summarized for giving the low thermal expansion coefficients:

(1) the main skelton has a benzene ring and an imide ring, (2) the bonding of the benzene ring is by the para-bonding, and (3) the benzene ring can contain a substituent such as a methyl group at side chains.

TABLE 1

| Example No. | Diamine Name | Diamine Amount (g) | Tetracarboxylic acid dianhydride Name | Tetracarboxylic acid dianhydride Amount (g) | Linear expansion coefficient $\times 10^{-5} K^{-1}$ Bifix cure | Linear expansion coefficient $\times 10^{-5} K^{-1}$ Free cure | Note |
|---|---|---|---|---|---|---|---|
| Example 1 | p-PDA | 49.72 | PMDA | 100.3 | — | — | Brittle |
| Example 2 | " | 40.31 | BPDA | 109.7 | 0.9 | 2.1 | |
| Comparative Example 1 | " | 37.69 | BTDA | 112.3 | 2.3 | 4.7 | |
| Example 3 | DATP | 81.62 | PMDA | 68.38 | 0.6 | 1.0 | |
| Example 4 | " | 70.42 | BPDA | 79.58 | 0.6 | 1.5 | |
| Comparative Example 2 | " | 67.03 | BTDA | 82.97 | 2.1 | 3.3 | |
| Example 5 | o-TOLID | 75.03 | PMDA | 74.97 | 0.3 | 0.8 | |
| Example 6 | " | 63.89 | BPDA | 86.11 | 0.6 | 2.8 | |
| Comparative Example 3 | " | 60.58 | BTDA | 89.42 | 1.9 | 5.8 | |
| Example 7 | p-DATOL | 53.85 | PMDA | 96.15 | 0.04 | 1.6 | |
| Example 8 | " | 44.01 | BPDA | 106.0 | 0.8 | 1.9 | |
| Comparative Example 4 | " | 41.24 | BTDA | 108.8 | 2.8 | 5.0 | |
| Comparative Example 5 | m-DATOL | 53.85 | PMDA | 96.15 | — | — | |

TABLE 1-continued

| Example No. | Diamine Name | Amount (g) | Tetracarboxylic acid dianhydride Name | Amount (g) | Linear expansion coefficient $\times 10^{-5} K^{-1}$ Bifix cure | Free cure | Note |
|---|---|---|---|---|---|---|---|
| Comparative Example 6 | " | 44.01 | BPDA | 106.0 | 3.2 | 5.0 | |
| Comparative Example 7 | " | 41.24 | BTDA | 108.8 | 3.5 | 5.1 | |
| Comparative Example 8 | m-PDA | 49.72 | PMDA | 100.3 | 3.9 | 4.0 | |
| Comparative Example 9 | " | 40.31 | BPDA | 109.7 | 4.0 | 4.2 | |
| Comparative Example 10 | " | 37.69 | BTDA | 112.3 | 3.1 | 3.9 | |
| Comparative Example 11 | DDE | 71.79 | PMDA | 78.21 | 2.36 | 5.13 | |
| Comparative Example 12 | " | 60.75 | BPDA | 89.25 | 4.32 | 5.20 | |
| Comparative Example 13 | " | 57.49 | BTDA | 92.51 | 4.28 | 5.52 | |
| Comparative Example 14 | DDS | 74.69 | PMDA | 75.31 | 4.84 | 6.03 | |
| Comparative Example 15 | " | 74.69 | BPDA | 86.45 | 4.91 | 5.85 | |
| Comparative Example 16 | " | 60.25 | BTDA | 89.75 | 5.62 | 5.78 | |
| Comparative Example 17 | DDM | 71.42 | PMDA | 78.58 | 4.20 | 4.50 | |
| Comparative Example 18 | " | 60.39 | BPDA | 89.61 | 4.18 | 5.03 | |
| Comparative Example 19 | " | 57.14 | BTDA | 92.86 | 4.50 | 5.00 | |
| Comparative Example 20 | BAPB | 94.22 | PMDA | 55.78 | 5.33 | 6.32 | |
| Comparative Example 21 | " | 83.4 | BPDA | 66.6 | 5.32 | 6.17 | |
| Comparative Example 22 | " | 80.02 | BTDA | 69.98 | 4.30 | 4.37 | |
| Comparative Example 23 | DAPP | 97.95 | PMDA | 52.05 | 5.11 | 6.57 | |
| Comparative Example 24 | " | 87.38 | BPDA | 62.62 | 5.70 | 5.80 | |
| Comparative Example 25 | " | 84.04 | BTDA | 65.96 | 5.39 | 5.59 | |
| Comparative Example 26 | DAPFP | 105.6 | PMDA | 44.42 | 4.75 | 6.37 | |
| Comparative Example 27 | " | 95.69 | BPDA | 54.31 | 5.23 | 6.15 | |
| Comparative Example 28 | " | 92.51 | BTDA | 57.49 | 5.47 | 6.24 | |

Note
p-PDA = p-phenylenediamine
DATP = 4,4"-diaminoterphenyl
o-TOLID = o-tolidine
p-DATOL = 2,5-diaminotoluene
m-DATOL = 2,4-diaminotoluene
m-PDA = m-phenylenediamine
DDE = 4,4'-diamiono ether
DDS = 4,4'-diamino sulfide
DDM = 4,4'-diamino diphenyl methane
BAPB = 4,4'-bis(4-aminophenoxy)biphenyl
DAPP = 2,2-bis{4-(4-aminophenoxy)phenyl}propane
DAPFP = 2,2-bis{4-(4-aminophenoxy)phenyl}hexafluoropropane
DMDA = pyromellitic dianhydride
BPDA = 3,3',4,4'-biphenyltetracarboxylic dianhydride
BTDA = 3,3',4,4'-benzophenonetetracarboxylic dianhydride

EXAMPLES 9 to 14

The low thermal expansion polyimides of this invention can be blended or copolymerized with conventional polyimides having larger thermal expansion coefficients or with conventional polyamide-acid to control the thermal expansion coefficients properly.

Thermal expansion coefficients of copolymerized or blended materials are shown in Table 2. As is clear from Table 2, there is almost a linear relation between the copolymerization or blending ratio and the thermal expansion coefficient. This means that control of the thermal expansion coefficient can be effected easily.

TABLE 2

| Example No. | Mixing proportion(g) p-PDA | DDE | BPDA | Linear expansion coefficient $\times 10^{-5} K^{-1}$ Bifix cure | Free cure | Note |
|---|---|---|---|---|---|---|
| Example 9 | 34.83 | 21.5 | 93.67 | 3.3 | 1.7 | Copolymer |
| Example 10 | 21.78 | 40.34 | 87.88 | 4.1 | 3.0 | " |

TABLE 2-continued

| Example No. | Mixing proportion(g) p-PDA | DDE | BPDA | Linear expansion coefficient $\times 10^{-5} K^{-1}$ Bifix cure | Free cure | Note |
|---|---|---|---|---|---|---|
| Example 10 | | | | | | |
| Example 11 | 10.26 | 56.98 | 82.76 | 5.6 | 4.3 | " |
| Example 12 | 34.83 | 21.5 | 93.67 | 3.0 | 1.5 | Blend of Example 1 and Comparative Example 12 |
| Example 13 | 21.78 | 40.34 | 87.88 | 3.7 | 2.6 | Blend of Example 1 and Comparative Example 12 |
| Example 14 | 10.26 | 56.98 | 82.76 | 4.5 | 3.8 | Blend of Example 1 and Comparative Example 12 |

EXAMPLE 15 (EXAMINATION OF PROPERTIES)

(1) Samples

A polyamide-acid varnish was prepared by reacting an aromatic diamine as listed in Table 3 with an aromatic tetracarboxylic dianhydride as listed in Table 3 in N-methyl-2-pyrrolidone at room temperature. The varnish was coated on a glass plate and dried at 100° C. for 1 hour. Then, the resulting film was stripped off and cured at 200° C. for 1 hour and at 400° C. for 1 hour in a nitrogen gas to give a polyimide film. It was also found that behavior for thermal expansion changed when curing shrinkage was conducted freely (free cure) or shrinkage was prevented by fixing on an iron frame at one direction (unifix cure) or at two directions (bifix cure).

TABLE 3

$$\left[-R_1-N\begin{array}{c}CO\\CO\end{array}R_2\begin{array}{c}CO\\CO\end{array}N-\right]$$

—R₁—

(A) —⌬— (p-PDA)

(B) (m-PDA)

(C) CH₃—⌬—⌬—CH₃ (o-TOLID)

(D) —⌬—⌬—⌬— (DATP)

(E) —⌬—O—⌬— (DDE)

(F) —⌬—S—⌬— (DDS)

(G) —⌬—CH₂—⌬— (DDM)

(H) (m-DATOL) with CH₃

(I) —⌬—O—⌬—⌬—O—⌬— (BAPB)

(J) —⌬—O—⌬—C(CH₃)₂—⌬—O—⌬— (DAPP)

(K) —⌬—O—⌬—C(CF₃)₂—⌬—O—⌬— (DAPFP)

\R₂/

(1) (PMDA)

(2) (BPDA)

(3) (BTDA) with C=O

Note
A resin number is determined by a combination of (A) to (K) as R₁ and (1) to (3) as R₂. For example, No. A2 means a polyimide having the structure of (A) as R₁ and (2) as R₂.

(2) Coefficients of thermal expansion

A film of 5 mm wide, 65 mm long (between chucks) and 20 to 100 μm thick was used as a sample. The sample was applied to a thermal mechanical analyzer (TMA 1500, mfd. by Shinku Riko K.K.) and measured under the conditions of 5° C./min. Since the thermal expansion coefficient had temperature-dependency, an average value between 50 to 250° C. was used as a representative value.

(3) Wide angle X-ray diffraction

A sample of 30 mm wide, 40 mm long and about 40 μm thick was measured by using a Geiger-Flex RAD (mfd. by Rigaku Denki Co., Ltd.)

(4) Results and Discussions

Figure 8:
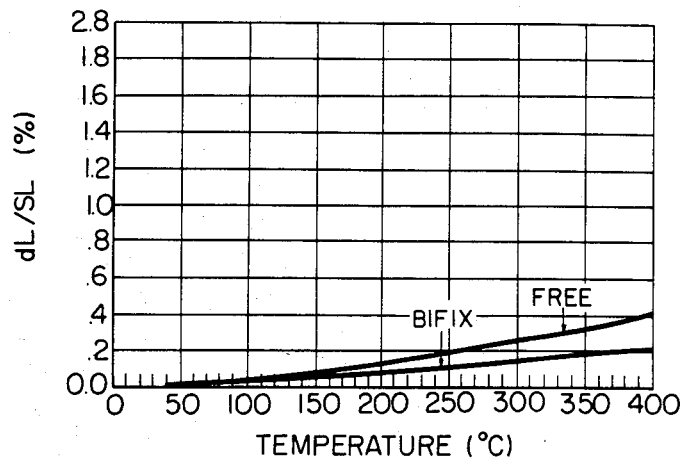
FIG. 8 is a graph showing the behavior of thermal expansion for No. D1.

It was found that behavior of thermal expansion for polyimides changed variously whether curing shrinkage in the course of heat cure of polyamide-acid film to polyimide was prevented or not. FIG. 8 shows behavior of thermal expansion for polyimide No. D1 obtained from DATP and PMDA. The thermal expansion coefficient of conventional polyimide is usually 4 to $6 \times 10^{-5}$ $K^{-1}$ and there is a dimensional change of 0.8 to 1.2% with the temperature change of from 50 to 250° C. In contrast, the polyimide of No. D1 shows dimensional change of about 0.2% (free cure) or about 0.1% (bifix cure) in the temperature range of 50 to 250° C.

Figure 9:
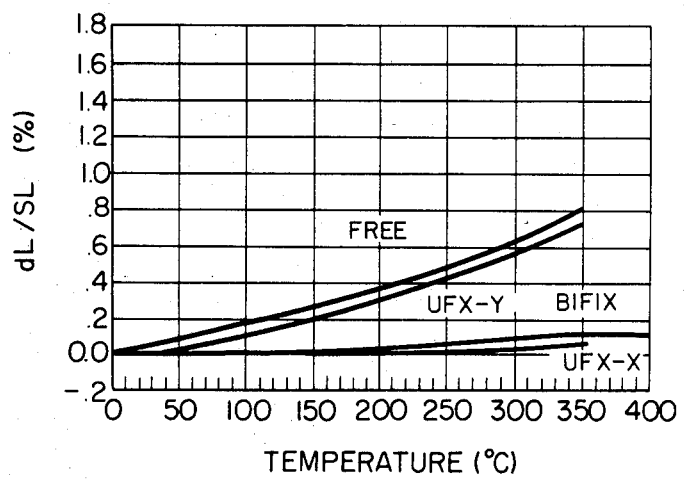
FIG. 9 is a graph showing the behavior of thermal expansion for No. A2.

FIG. 9 also shows the behavior of thermal expansion for polyimide No. A2. The dimensional change by the bifix cure is 0.1% or less, while that by free cure becomes as large as about 0.4% in the range of 50 to 250° C. with a relative increase of thermal expansion coefficient. Using this sample (No. A2), prevention of curing shrinkage at only one axis was also studied. As a result, it was found that at the prevented direction (UFX-X) the thermal expansion coefficient became smaller and the dimensional change was almost 0% up to near 250° C. But, at the direction perpendicular to the controlled direction (UFX-Y), the behavior was almost the same as the case of free cure. That is, by a method for giving a slight curing shrinkage (linear shrinkage, about 10%) at the time of imidization, the resulting effect was the same as that obtained by stretching a conventional prepolymer several to several tens times.

Figure 10:
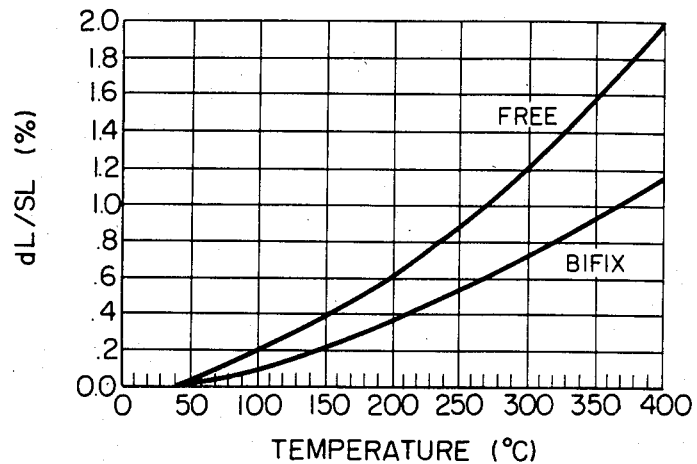
FIG. 10 is a graph showing the behavior of thermal expansion for No. A3.
Figure 11:
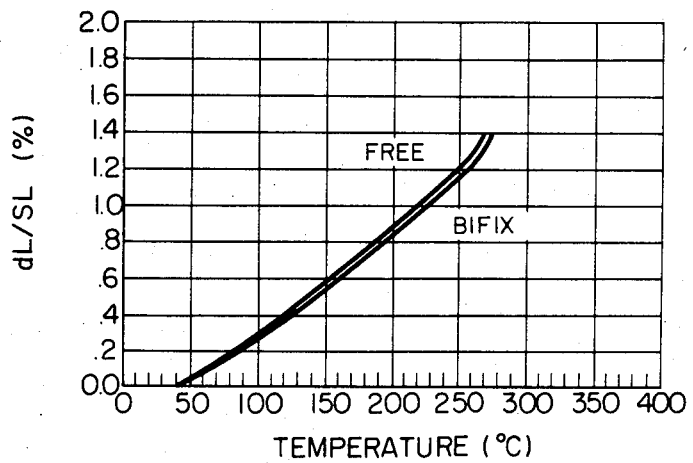
FIG. 11 is a graph showing the behavior of thermal expansion for No. F3.

Similarly, behavior of thermal expansion for Nos. A3 and F3 (these being conventional polyimides) is also shown in FIGS. 10 and 11.

Figure 12:
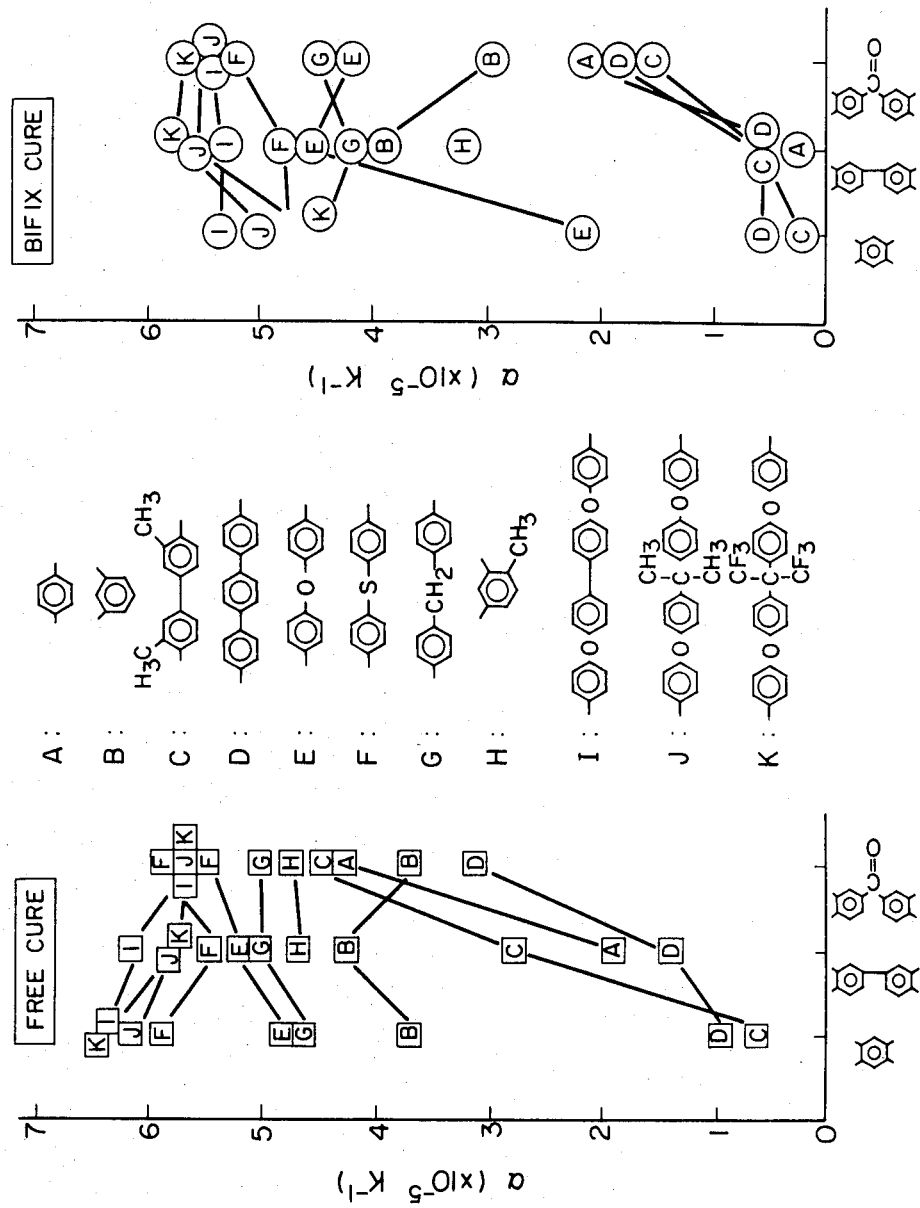
FIG. 12 are graphs showing coefficients of thermal expansion for polyimides.

FIG. 12 shows a relationship between the chemical structures and thermal expansion coefficients.

From the above results, the kinds of polyimides can roughly be divided into the following 4 groups.

① Polyimides having small thermal expansion coefficients both in free cure and bifix cure. This group includes those obtained from a combination of o-TOLID or DATP, and PMDA.

② Polyimides having slightly large thermal expansion coefficients in the case of free cure but having about half values in the case of bifix cure. This group includes those obtained from a combination of BPDA and p-PDA, o-TOLID or DATP.

③ Polyimides having considerably large thermal expansion coefficients in the case of free cure but having about half values in the case of bifix cure. This group includes those obtained from a combination of p-PDA, o-TOLID, DATP, or m-PDA, and BTDA, a combination of DDE and PMDA, or a combination of 2,4-DATO and BPDA.

④ Polyimides having large thermal expansion coefficients both in free cure and bifix cure. Almost all polyimides other than those mentioned above belong to this group.

Figure 13:
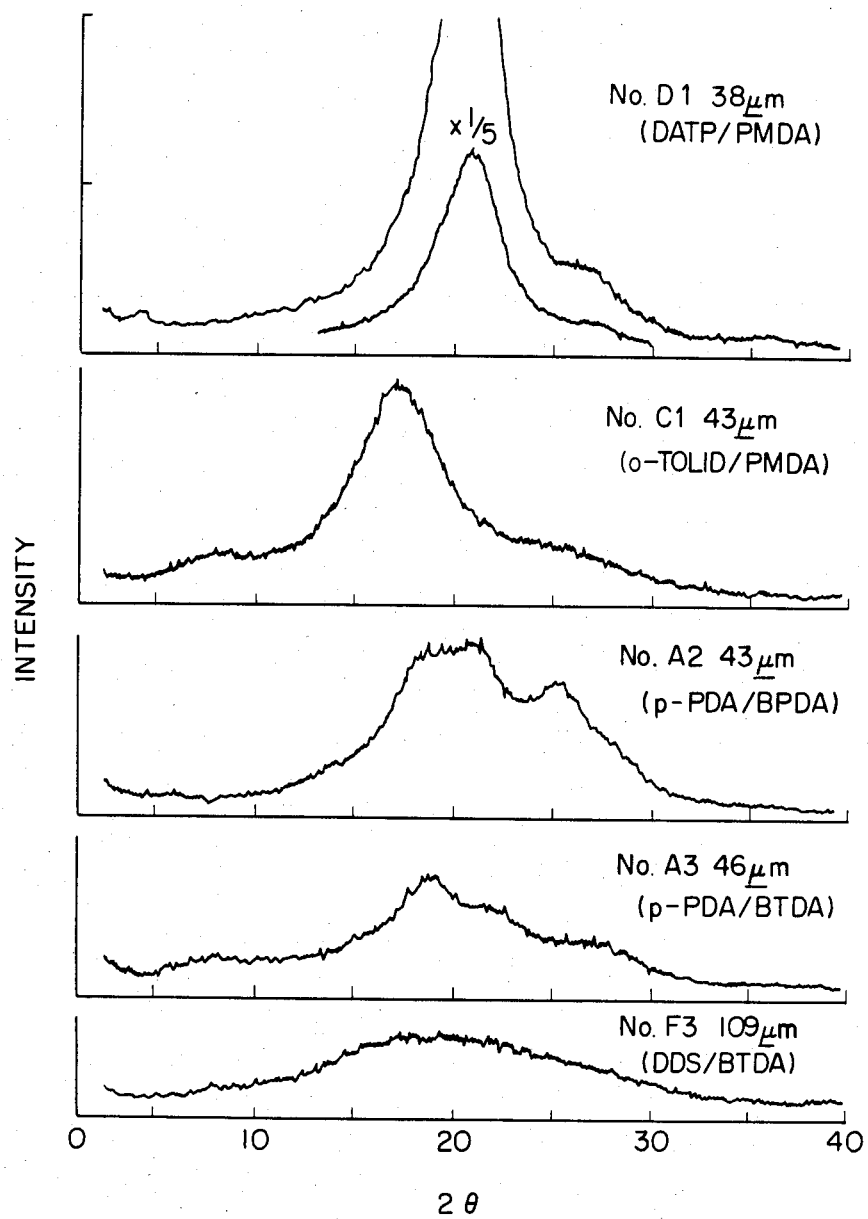
FIG. 13 are diffractograms for bifix-cured polyimides.

On the other hand, it is well known that thermal expansion coefficients of polymers become smaller by crystallization caused by stretching. Crystallizability of polyimides was studied by using wide angle X-ray diffraction. Measured results were shown in FIGS. 13 and 14. FIG. 13 shows that No. D1 belonging to the group ① has sharp reflection and thus has crystallizability. Similarly, No. C1 seems to have crystallizability to some extent. In contrast to them, Nos. A2 of the group ② and No. A3 of the group ③ have slight orientation compared with No. F3 of the group ④, but they seem to have no crystallizability in contrast to Nos. D1 and C1.

Figure 14:
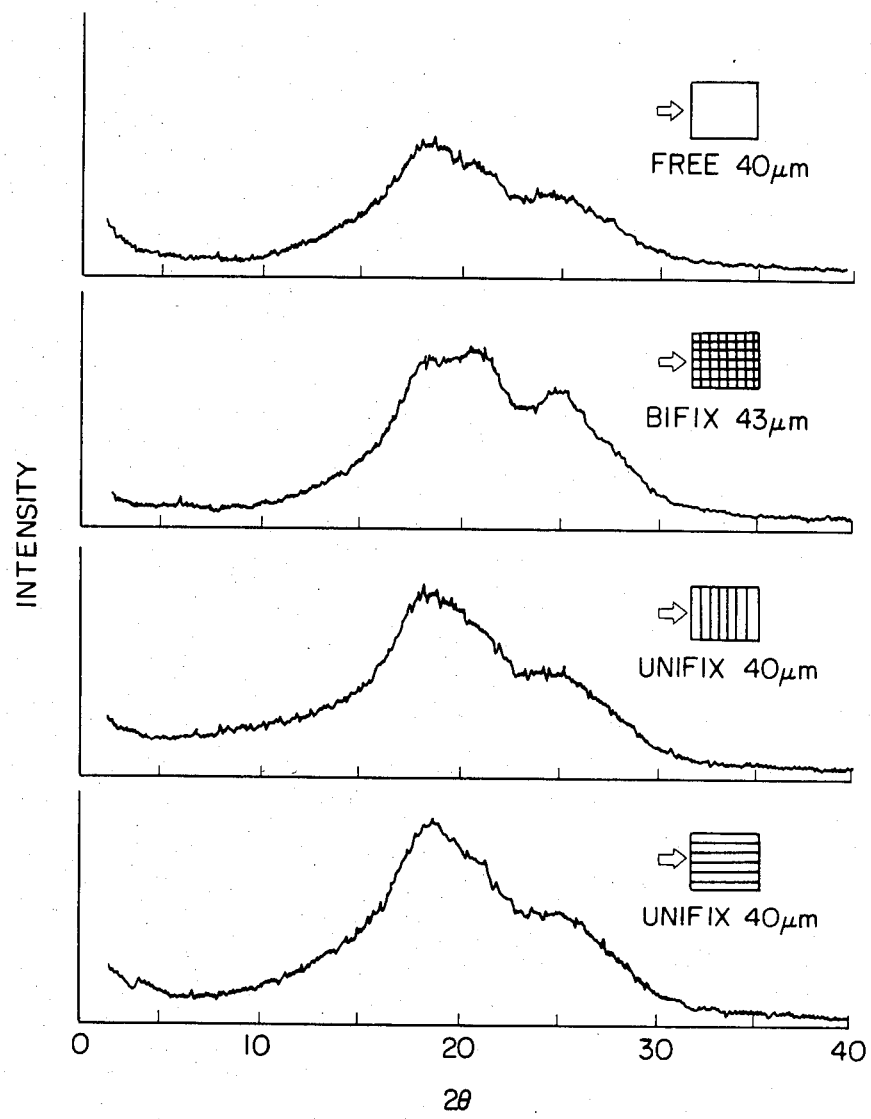
FIG. 14 are diffractograms for A3 films.

In FIG. 14, differences due to free cure, bifix cure, UFX-X and UFX-Y were studied as to No. A2, but there is almost no difference in wide angle X-ray diffraction data. If evaluated in detail, there is a tendency that the height of the curve is lower in the case of free cure. From these results, there is a clear tendency that the stronger the crystallizability is, the smaller the thermal expansion coefficient becomes. But the controlling effect on curing shrinkage cannot be explained sufficiently by this only. The degree of order in more longer distance seems to be also important.

Next place, conformations of polyimides belonging to individual groups ① to ④ studied. As shown shown in FIG. 15, it can be admitted some community to some extent. The polyimides belonging to the group ① can only take conformation wherein both the diamine and tetracarboxylic acid components lie linearly on almost the same plane as shown in FIG. 15 (I). Therefore, they are rod-like at the direction of molecular axis and rigid, as well as liable to be crystallized. The polyimides belonging to the group ② have considerably linear conformation, although take a somewhat zigzag structure due to the biphenyl of BPDA as shown in FIG. 15 (II). The polyimides belonging to the group ③ can further be divided into two groups; one of which is formed from p-PDA, o-TOLID or DATP and BTDA and lies on almost the same plane as shown in FIG. 15 (III) but is hardly arranged on a straight line depending on benzophenone skeltons, and another of which turns at the ether bonds as shown in FIG. 15 (IV) and does not lie on the same plane but the skelton between two ether bonds lies linearly. The polyimides obtained from a combination of PMDA and DDM or DDS also belong to the same type. Almost all the other polyimides lose regularity by ether, thioether, methylene, ketone, or the like as shown in FIG. 15 (V).

What is claimed is:

1. A low thermal expansion resin material comprising a polyimide having as a chemical structural unit at least one aromatic ring which can rotate around its molecular axis but which has no flexibility in another direction and which is bonded at para positions, said polyimide having a molecular chain oriented so as to have a substantially linear structure on a plane by stretching a film of the polyimide or a precursor thereof uniaxially or biaxially with stretcher and exhibiting a linear thermal expansion coefficient of $3 \times [10^5]10^{-5}$ to $4 \times 10^{-7}$ $k^{-1}$.

2. A resin material according to claim 1, wherein the polyimide has a main chain containing one or more repeating units of the formulae:

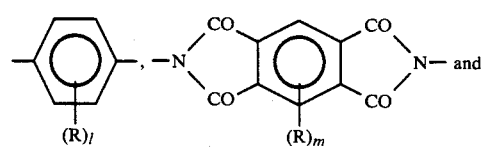

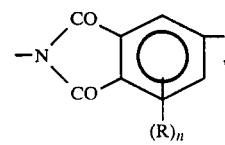

wherein R is an alkyl group, a fluorinated alkyl group, an alkoxy group, a fluorinated alkoxy group, an acyl group, or a halogen atom; l is zero or an integer of 1 to 4; m is zero or an integer of 1 to 2; and n is zero or an integer of 1 to 3.

3. A resin material according to claim 1, wherein the polyimide has as repeating unit at least one member selected from the group consisting of the following formulae:

wherein R is an alkyl group, a fluorinated alkyl group, an alkoxy group, a fluorinated alkoxy group, an acyl group, or a halogen atom; l is zero or an integer of 1 to 4; m is zero or an integer of 1 to 2; n is zero or an integer of 1 to 3; and k is zero or an integer of 1 to 3.

4. A resin material according to claim 1, wherein the polyimide is copolymerized or blended with another polymer.

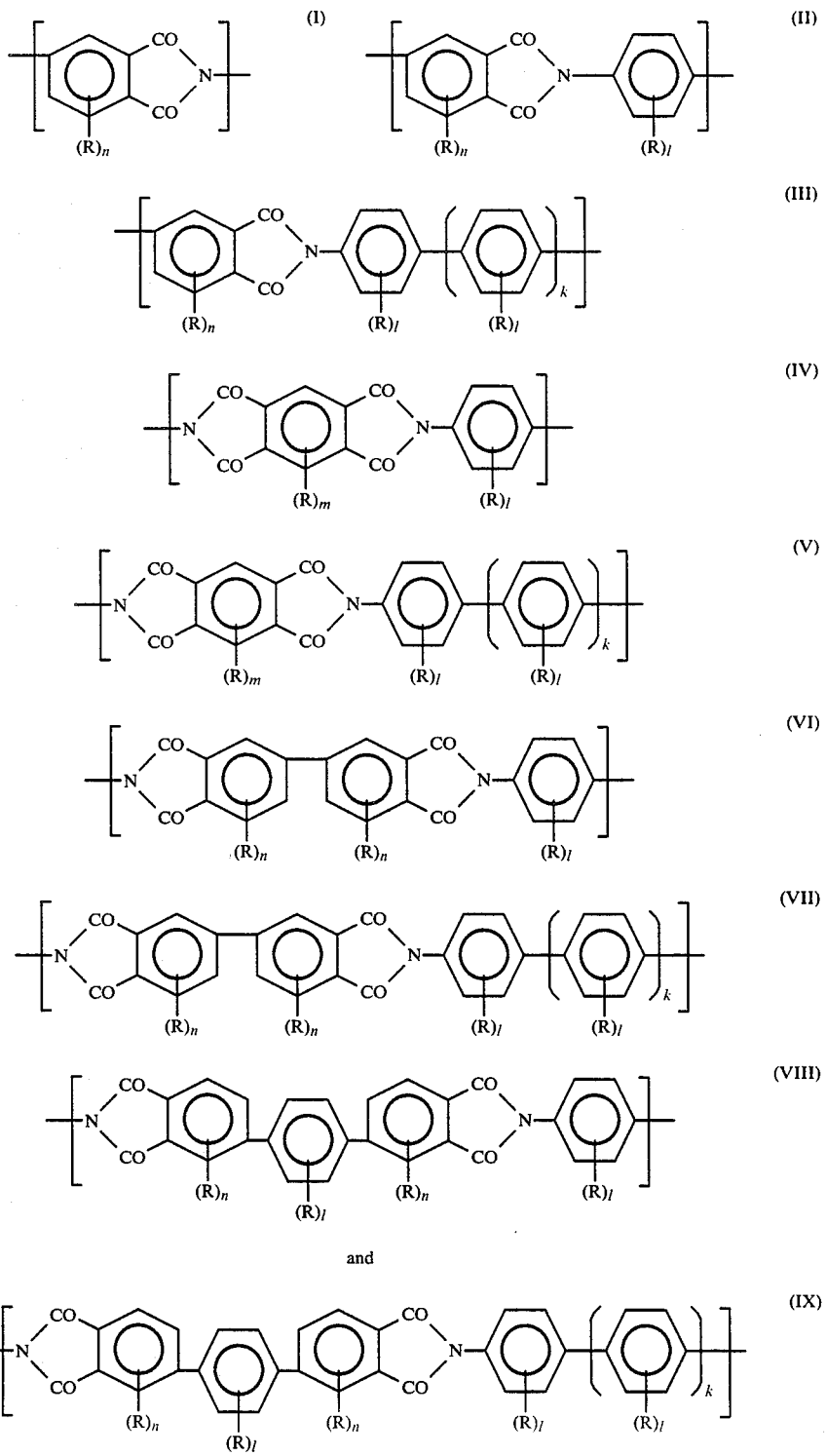

5. A resin material according to claim 1, wherein the polyimide is obtained by polymerization of an aromatic aminodicarboxylic acid derivative, or obtained by reacting an aromatic diamine, or aromatic diisocyanate with an aromatic tetracarboxylic acid derivative.

6. A resin material according to claim 1, wherein the low thermal expansion resin material comprises a linear molecular chain that is oriented uniaxially or biaxially and is in the form of a film.

7. A resin material according to claim 4, wherein said another polymer is a polyimide obtained from a diamine and a tetracarboxylic acid derivative.

8. A resin material according to claim 1, wherein the resin material is in the form of a film, said polyimide having a linear molecular chain that is oriented biaxially.

9. A resin material according to claim 1, wherein the resin material is in the form of a film, said polyimide having a linear molecular chain that is oriented uniaxially.

10. A resin material according to claim 3, wherein the polyimide has as repeating unit at least one member selected from the group consisting of formulae (I), (II), and (IV).

11. A resin material according to claim 3, wherein the polyimide has as repeating unit at least one member selected from the group consisting of the formulae of (II), (III), (IV), (V), (VI), (VII), (VIII) and (IX).

12. A resin material according to claim 1, wherein the at least one aromatic ring is a benzene ring.

* * * * *